US012812986B2

(12) United States Patent
Tsai et al.

(10) Patent No.: US 12,812,986 B2
(45) Date of Patent: Nov. 24, 2026

(54) PHOTO-DETECTING DEVICE

(71) Applicant: Ennostar Corporation, Hsinchu city (TW)

(72) Inventors: Chang Da Tsai, Hsinchu (TW); I-Hung Chen, Hsinchu (TW); Yu Cheng Su, Hsinchu (TW)

(73) Assignee: ENNOSTAR CORPORATION, Hsinchu City (TW)

( * ) Notice: Subject to any disclaimer, the term of this patent is extended or adjusted under 35 U.S.C. 154(b) by 254 days.

(21) Appl. No.: 18/584,699

(22) Filed: Feb. 22, 2024

(65) Prior Publication Data

US 2024/0290902 A1 Aug. 29, 2024

(30) Foreign Application Priority Data

Feb. 23, 2023 (TW) ................................ 112106689

(51) Int. Cl.

| | |
|---|---|
| ***H10F 30/222*** | (2025.01) |
| ***H10F 55/255*** | (2025.01) |
| ***H10F 77/124*** | (2025.01) |
| ***H10F 77/30*** | (2025.01) |
| ***H10F 77/50*** | (2025.01) |

(52) U.S. Cl.

CPC ......... *H10F 30/222* (2025.01); *H10F 55/255* (2025.01); *H10F 77/1248* (2025.01); *H10F 77/306* (2025.01); *H10F 77/337* (2025.01); *H10F 77/50* (2025.01)

(58) Field of Classification Search

CPC ............................ H10F 30/222; H10F 30/288

See application file for complete search history.

(56) References Cited

U.S. PATENT DOCUMENTS

| | | | | |
|---|---|---|---|---|
| 5,471,076 | A | 11/1995 | Murakami et al. | |
| 10,079,324 | B2 | 9/2018 | Yamaguchi | |
| 10,401,543 | B1 * | 9/2019 | Shi | G02B 5/22 |

FOREIGN PATENT DOCUMENTS

| | | | |
|---|---|---|---|
| CN | 110176507 | A | 8/2019 |
| CN | 115458624 | B | 3/2023 |
| TW | 201717418 | A | 5/2017 |

* cited by examiner

*Primary Examiner* — Shih Tsun A Chou

(74) *Attorney, Agent, or Firm* — MUNCY, GEISSLER, OLDS & LOWE, P.C.

(57) ABSTRACT

A light-detecting device includes a base, a first absorption layer, a second absorption layer and a first semiconductor layer. The first absorption layer is located on the base and has a first band gap. The second absorption layer is located between the first absorption layer and the base and has a second band gap and a first dopant. The first semiconductor layer is located between the first absorption layer and the second absorption layer and has a third band gap. The second band gap is equal to or greater than the first band gap, and a third band gap greater than the first band gap and the second band gap. The first absorption layer does not include the first dopant.

20 Claims, 7 Drawing Sheets

PHOTO-DETECTING DEVICE

TECHNICAL FIELD

The present disclosure relates to a semiconductor light-detecting device, and particularly to a semiconductor light-detecting device including a first absorption layer, a second absorption layer and a first semiconductor layer.

CROSS REFERENCE TO RELATED APPLICATION

This application claims the right of priority based on TW application Serial No. 112106689, filed on Feb. 23, 2023, and the content of which is hereby incorporated by reference in its entirety.

DESCRIPTION OF BACKGROUND ART

A semiconductor optoelectronic device mainly involves the conversion between light and electricity. A light-emitting device, such as a light-emitting diode (LED) or a laser diode (LD), can convert electricity to light, and a photovoltaic cell (PVC) or a light-detecting device, such as photodiode (PD), can convert light to electricity. LEDs have been widely applied to illumination and light sources of various electronic devices, and LDs have also been applied to projectors and proximity sensors extensively. PVCs can be applied to power plants and power generation centers for use in space, and PDs can be applied to fields of light sensing and communication. With the expansion of the functions of personal electronic devices, the light-detecting device is gradually being used in fields of ranging, security and physiological monitoring, and the requirements for accuracy in the wavelength range of light detection are getting higher and higher.

SUMMARY OF THE DISCLOSURE

The present disclosure provides a light-detecting device. The light-detecting device includes a base, a first absorption layer, a second absorption layer and a first semiconductor layer. The first absorption layer is located on the base and has a first band gap. The second absorption layer is located between the first absorption layer and the base and has a second band gap and a first dopant. The first semiconductor layer is located between the first absorption layer and the second absorption layer and has a third band gap. The second band gap is equal to or greater than the first band gap, and a third band gap greater than the first band gap and the second band gap. The first absorption layer does not include the first dopant.

The present disclosure further provides a photo-detecting module. The photo-detecting module includes a light-emitting device, the light-detecting device, a carrier electrically connecting to the light-emitting device and the light-detecting device, and an encapsulation structure covering the light emitting device and the light-detecting device.

BRIEF DESCRIPTION OF THE DRAWINGS

The foregoing aspects and many of the attendant advantages of the present disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1A:
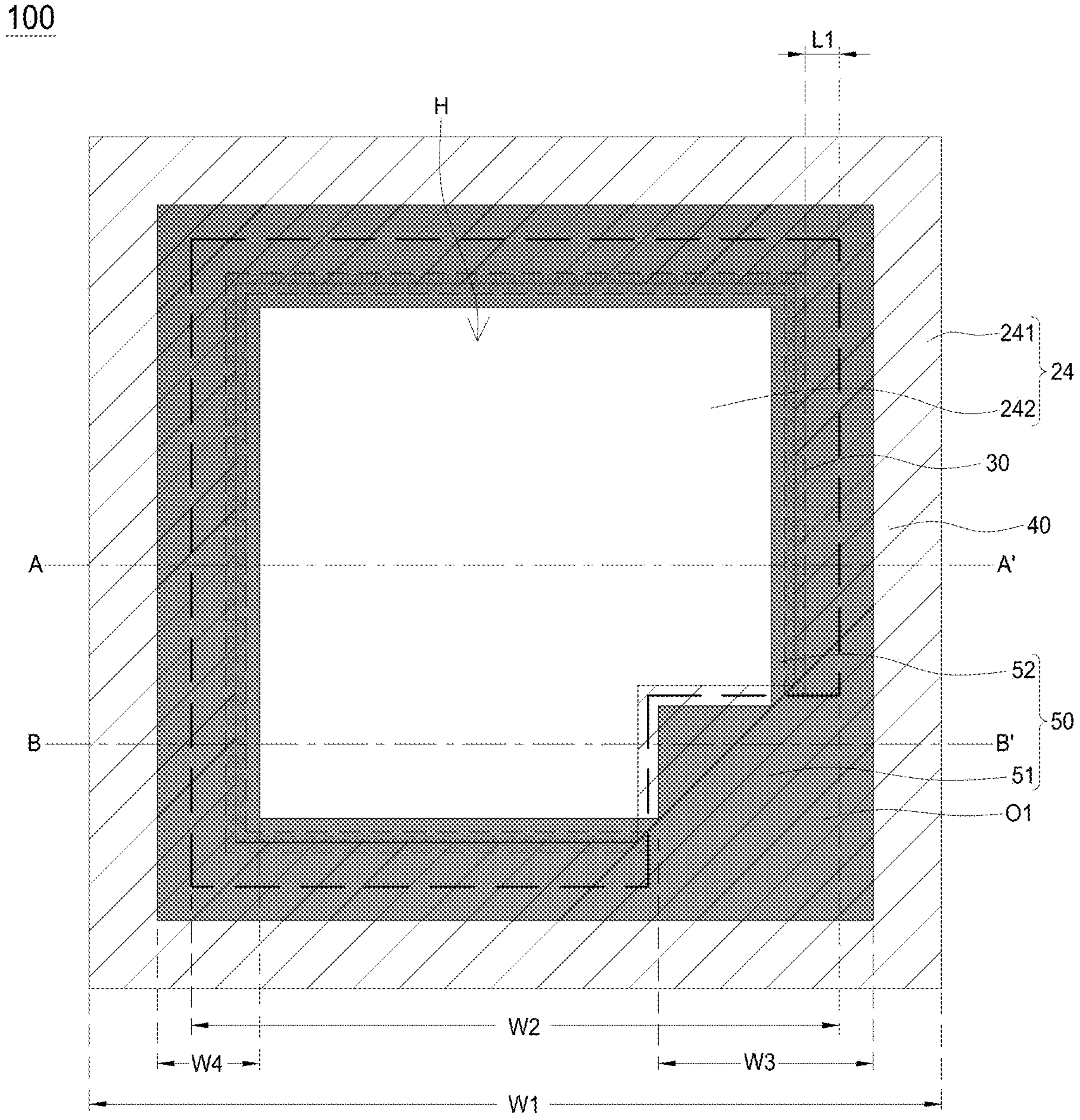
FIG. 1A shows a top perspective view of a light-detecting device according to one embodiment of the present disclosure.

The following embodiments will be described with accompany drawings to disclose the concept of the present disclosure. In the drawings or description, same or similar portions are indicated with same or similar numerals. Furthermore, a shape or a size of a member in the drawings may be enlarged or reduced. Particularly, it should be noted that a member which is not illustrated or described in drawings or description may be in a form that is known by a person skilled in the art.

A person skilled in the art can realize that addition of other components based on a structure recited in the following embodiments is allowable. For example, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

In the present disclosure, if not otherwise specified, the general formula InGaP represents $In_{x0}Ga_{1-x0}P$, wherein $0<x0<1$; the general formula AlInP represents $Al_{x1}In_{1-x1}P$, wherein $0<x1<1$; the general formula AlGaInP represents $Al_{x2}Ga_{x3}In_{1-x2-x3}P$, wherein $0<x2<1$ and $0<x3<1$; the general formula InGaAsP represents $In_{x4}Ga_{1-x4}As_{x5}P_{1-x5}$, wherein $0<x4<1$, $0<x5<1$; the general formula AlGaInAs represents $Al_{x6}Ga_{x7}In_{1-x6-x7}As$, wherein $0<x6<1$ and $0<x7<1$; the general formula InGaAsN represents $In_{x8}Ga_{1-x8}As_{x9}N_{1-x9}$, wherein $0<x8<1$ and $0<x9<1$; the general formula InGaAs represents $In_{x10}Ga_{1-x10}As$, wherein $0<x10<1$; the general formula AlGaAs represents $Al_{x11}Ga_{1-x11}As$, wherein $0<x11<1$. The content of each element may be adjusted for different purposes, for example, for adjusting the band gap, or the cut-off wavelength of a light-detecting device. However, the present disclosure is not limited thereto.

In addition, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not directly contact each other. Furthermore, it should be realized that a positional relationship of a layer/structure may be altered when being observed in different orientations.

Figure 1B:
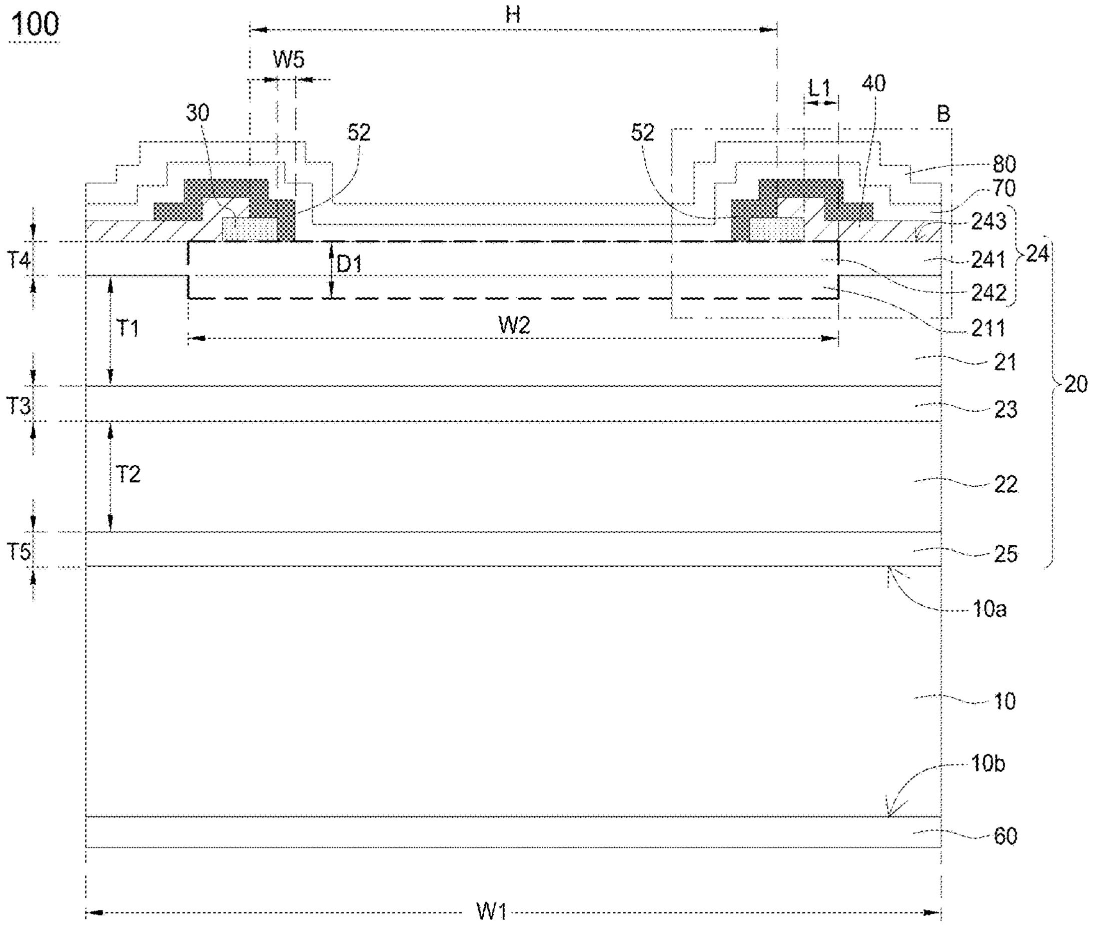
FIG. 1B shows a schematic sectional view of the light-detecting device in FIG. 1A along a section line A-A'.

FIG. 1A is a schematic top perspective view of the light-detecting device 100 according to one embodiment of the present disclosure. FIG. 1B is a schematic sectional view along a section line A-A' in FIG. 1A. FIG. 1D is a schematic sectional view along a section line B-B' in FIG. 1A. The light-detecting device 100 can absorb an incident light and convert the incident light into an electrical signal. As shown in FIGS. 1A to 1D, the light-detecting device 100 includes a base 10, a semiconductor stack 20 located on the base 10, and a first electrode 50 and a second electrode 60 located on two opposite sides of the semiconductor stack 20 respectively. The light-detecting device 100 optionally includes a contact structure 30 located between the semiconductor stack 20 and the first electrode 50 and a passivation layer 40 located on the semiconductor stack 20 and the contact structure 30.

The base 10 includes a first surface 10*a* and a second surface 10*b* opposite to the first surface 10*a*. The semiconductor stack 20 is located on the first surface 10*a* of the base 10 and includes a first absorption layer 21, a second absorption layer 22 located between the first absorption layer 21 and the base 10, and a first semiconductor layer 23 located between the first absorption layer 21 and the second absorption layer 22. In one embodiment, the first electrode 50 is disposed on the first absorption layer 21 to electrically connect to the first absorption layer 21, and the second electrode 60 is disposed on the second surface 10*b* of the base 10 to electrically connect to the second absorption layer 22 through the base 10. As such, the electrical signal generated by the light-detecting device 100 can be output through the first electrode 50 and the second electrode 60. In one embodiment, the light-detecting device 100 further includes a second semiconductor layer 24 located on the first absorption layer 21 and a third semiconductor layer 25 located between the second absorption layer 22 and the base 10. The first electrode 50 can be disposed on the second semiconductor layer 24. In one embodiment, the base 10 and the third semiconductor layer 25 or the second absorption layer 22 are lattice-matched to each other. The term "lattice-matched" refers to a ratio of the difference between the lattice constants of two adjacent layers to the average of the lattice constants of two adjacent layers is smaller than or equal to 0.1%.

The first semiconductor layer 23, the second semiconductor layer 24 and the third semiconductor layer 25 may include the same or different materials. The first semiconductor layer 23 and the third semiconductor layer 25 have a first conductivity type and a first dopant, the second semiconductor layer 24 has a second conductivity type and a second dopant, and the second conductivity type is different from the first conductivity type. For example, the first conductivity type and the second conductivity type can be n-type and p-type, or p-type and n-type respectively. In one embodiment, the second semiconductor layer 24 further includes an unmodified region 241 and a first modified region 242. The unmodified region 241 has the first conductivity type and a third dopant, and the first modified region 242 has the second dopant and the third dopant. The first dopant and the third dopant can be the same or different, and the first dopant and the third dopant are different from the second dopant.

In one embodiment, in the first modified region 242, a doping concentration of the second dopant is greater than a doping concentration of the third dopant so that the first modified region 242 has the second conductivity type. The unmodified region 241 without the second dopant has the first conductivity type. The first dopant in the first semiconductor layer 23 and the third semiconductor layer 25 respectively has a first doping concentration and a second doping concentration, and the first doping concentration is the same or less than the second doping concentration. In one embodiment, the first doping concentration can be between $10^{17}$ and $2\times10^{18}/cm^3$, and the second doping concentration can be between $10^{17}$ and $5\times10^{18}/cm^3$. The third dopant in the second semiconductor layer 24 has a third doping concentration less than the first doping concentration and the second doping concentration. In one embodiment, the third doping concentration can be smaller than $5\times10^{16}/cm^3$. The second dopant in the second semiconductor layer 24 has a fourth doping concentration. In one embodiment, the fourth doping concentration can be between $2\times10^{17}$ and $5\times10^{19}/cm^3$. In one embodiment, the first semiconductor layer 23 can be a single-layer or multi-layer structure, and the first dopant concentration may have a gradient change or a layer-by-layer change. More specifically, in one embodiment, the first dopant concentration of the first semiconductor layer 23 may be gradually increased or decreased in a direction from the base 10 to the semiconductor stack 20. In another embodiment, the first semiconductor layer 23 may include a first sublayer and a second sublayer (not shown). The first doping concentrations of the first sublayer and the second sublayer may be different, and may be gradually increased or decreased.

The first absorption layer 21 is located between the first semiconductor layer 23 and the second semiconductor layer 24. The second absorption layer 22 is located between the first semiconductor layer 23 and the third semiconductor layer 25. The first absorption layer 21 of the light-detecting device 100 absorbs and converts the incident light into the electrical signal. In one embodiment, the first absorption layer 21 is undoped or unintentionally doped, and the second semiconductor layer 24, the first absorption layer 21 and the first semiconductor layer 23 form a p-i-n type light detecting device. The term "unintentional doped" refers to a situation that a doped element or a dopant naturally diffuse into the first absorption layer 21. For example, the first absorption layer 21 may include the first dopant from the first semiconductor layer 23 or/and the third dopant from the second semiconductor layer 24. When the first absorption layer 21 is unintentional doped, the sum of the doping concentrations of the first dopant and the third dopant in the first absorption layer 21 is less than $10^{16}/cm^3$. The second absorption layer 22 has a fourth dopant and the same first conductivity type as the first semiconductor layer 23 and the third semiconductor layer 25. The fourth dopant and the first dopant can be the same or different. In one embodiment, the fourth dopant in the second absorption layer 22 has a fifth doping concentration. In one embodiment, the fifth doping concentration can be between $5\times10^{17}/cm^3$ and $5\times10^{18}/cm^3$, that is, the doping concentration of the second absorption layer 22 is greater than that of the first absorption layer 21. The first dopant, the second dopant, the third dopant and the fourth dopant can respectively be zinc (Zn), beryllium (Be), magnesium (Mg), carbon (C), silicon (Si), germanium (Ge), tin (Sn), sulfur(S), selenium (Se), or tellurium (Te).

The materials of the first absorption layer 21 and the second absorption layer 22 can have the same or different band gaps to absorb light in the same or different wavelength ranges. In one embodiment, the first absorption layer 21 has a first thickness T1 and a first band gap Eg1, the second absorption layer 22 has a second thickness T2 and a second band gap Eg2, and the first band gap Eg1 is equal to or greater than the second band gap Eg2. Therefore, the first absorption layer 21 and the second absorption layer 22 can respectively absorb light with an energy greater than the first band gap Eg1 and the second band gap Eg2. In other words, the first absorption layer 21 has a first cut-off wavelength λ1 and can absorb light with a wavelength smaller than the first cut-off wavelength λ1. The second absorption layer 22 has a second cut-off wavelength λ2 and can absorb light with a wavelength smaller than the second cut-off wavelength λ2, and λ1≤λ2. According to actual applications, the first absorption layer 21 and the second absorption layer 22 can include materials with an band gap of 3.10 ev to absorb light with a wavelength below 400 nm (such as ultraviolet light); or materials with an band gap of 2.14 ev to absorb light with a wavelength below 580 nm (such as green light, blue light and ultraviolet light); or materials with an band gap of 0.73 ev to absorb light with wavelengths below 1700 nm (such as infrared light, red light, green light, blue light and ultraviolet light).

The first semiconductor layer 23 has a third thickness T3 and a third band gap Eg3, the second semiconductor layer 24 has a fourth thickness T4 and a fourth band gap Eg4, and the third semiconductor layer 25 has a fifth thickness T5 and a fifth band gap Eg5. The third band gap Eg3, the fourth band gap Eg4 and the fifth band gap Eg5 are greater than the first band gap Eg1 or/and the second band gap Eg2, and the third band gap Eg3, the fourth band gap Eg4 and the fifth band gap Eg5 can be the same or different. In other words, the first semiconductor layer 23, the second semiconductor layer 24 and the third semiconductor layer 25 respectively have a third cut-off wavelength λ3, a fourth cut-off wavelength λ4 and a fifth cut-off wavelength λ5, and the third cut-off wavelength λ3, the fourth cut-off wavelength λ4 and the fifth cut-off wavelength λ5 are less than the first cut-off wavelength λ1 and the second cut-off wavelength λ2 (λ3, λ4, λ5<λ1, λ2). That is, the wavelength range of light in which the first semiconductor layer 23, the second semiconductor layer 24 and the third semiconductor layer 25 can absorb is smaller than the wavelength range of light in which the first absorption layer 21 and the second absorption layer 22 can absorb.

As shown in FIG. 1B, a surface of the second semiconductor layer 24 away from the first absorption layer 21 is an incident plane 243 of the light-detecting device 100. When the light-detecting device 100 is in operation, light enters the second semiconductor layer 24 and the first absorption layer 21 from the incident plane 243, and is absorbed by the first absorption layer 21 to generate electrons and holes. Through applying an external bias, the electrons and holes move toward the first electrode 50 and the second electrode 60 respectively, or move toward the second electrode 60 and the first electrode 50 respectively to form a photocurrent. The light-detecting device 100 can have a target wavelength range according to application. The materials of the first absorption layer 21 and the second semiconductor layer 24 can be selected to make the fourth band gap Eg4 of the second semiconductor layer 24 larger than the first band gap Eg1 of the first absorption layer 21, so that the first absorption layer 21 can absorb light with a wavelength equal to the target wavelength range and the second semiconductor layer 24 can absorb light with a wavelength smaller than the target wavelength range.

For example, when the target wavelength range of the light-detecting device 100 is between 1300 nm and 1600 nm for detecting infrared light, the first band gap Eg1 of the first absorption layer 21 should not be greater than 0.77 eV, and the fourth band gap Eg4 of the second semiconductor layer 24 should not be greater than 0.96 eV. Assuming that the incident light includes a first light with a wavelength within the target wavelength range and a second light with a wavelength outside the target wavelength range (for example, between 400 nm and 1300 nm). As the incident light enters the incident plane 243, the second light can be absorbed by the second semiconductor layer 24, and the first light penetrates the second semiconductor layer 24 and is absorbed by the first absorption layer 21. Through selection of the band gaps of the first absorption layer 21 and the second semiconductor layer 24, the photocurrent generated by absorbing the light with a wavelength outside the target wavelength range in the first absorption layer 21 can be reduced. Thus, noise caused by the light with a wavelength outside the target wavelength range can be reduced.

On the other hand, in addition to entering the light-detecting device 100 through the incident plane 243, light may also enter and be absorbed by the first absorption layer 21 through a side surface of the light-detecting device 100 or reflection of the base 10. Since the incident light that does not enter from the incident plane 243 cannot pass through the second semiconductor layer 24, a portion of the incident light with a wavelength outside the target wavelength range may still be absorbed by the first absorption layer 21 and cause noise. In this embodiment, the second absorption layer 22 is disposed between the first absorption layer 21 and the base 10, so that the incident light entering from other positions except the incident plane 243 is absorbed by the second absorption layer 22 before reaching the first absorption layer 21. In addition, the second absorption layer 22 with the fourth dopant has a higher carrier concentration (electrons or holes) with respective to the undoped first absorption layer 21, so that electrons and holes generated by light absorption of the second absorption layer 22 are easy to recombine with the native carriers of the second absorption layer 22. Thus, the photocurrent output by the second absorption layer 22 is much less than the photocurrent output by the first absorption layer 21. That is to say, the electrical signal output by the light-detecting device 100 is mainly from the first absorption layer 21 instead of the second absorption layer 22, which enables the light-detecting device 100 to detect light with directionality. Furthermore, in one embodiment that the first band gap Eg1 is less than the second band gap Eg2, the second cutoff wavelength λ2 of the second absorption layer 22 is larger than the first cutoff wavelength λ1 of the first absorption layer 21, so that the second absorption layer 22 can absorb light in a wider wavelength range to further reduce the interference of light outside the target wavelength range. Therefore, the second absorption layer 22 can reduce noise and improve signal-to-noise ratio (S/N) of the light-detecting device 100.

In one embodiment, the first thickness T1 of the first absorption layer 21 can be between 1000 nm and 4000 nm. The second thickness T2 of the second absorption layer 22 can be between 500 nm and 3000 nm to achieve better light absorption and noise reduction effects. In one embodiment, the ratio of the first thickness T1 to the second thickness T2 is between 0.33 and 8. In one embodiment, the third thickness T3, the fourth thickness T4 and the fifth thickness T5 are all smaller than the first thickness T1 or/and the second thickness T2 to shorten the transmission path of the photocurrent and improve the detection sensitivity. In one embodiment, the third thickness T3 can be less than 1000 nm, the fourth thickness T4 can be between 500 nm and 1500 nm, and the fifth thickness T5 can be less than 1000 nm.

As shown in FIGS. 1B and 1D, the base 10 has a first width W1 in a horizontal direction, and the semiconductor stack 20 has a width substantially the same as the first width W1. The first modified region 242 has a second width W2 smaller than the first width W1. Further referring to FIG. 1A, the second semiconductor layer 24 has a top-view area. The first modified region 242 is surrounded by the unmodified region 241. In one embodiment, the area of the first modified region 242 can be 10% to 90% of the top-view area to have sufficient light absorption area. The second dopant can be added into the second semiconductor layer 24 through an ion implantation process or a diffusion process to form the first modified region 242. In one embodiment, the second dopant moves from the second semiconductor layer 24 to the first absorption layer 21 to form a second modified region 211 at a side of the first absorption layer 21 adjacent to the second semiconductor layer 24. The second modified region 211 connects to the first modified region 242, and has the second dopant and the second conductivity type. In one embodiment, the second modified region 211 has the third dopant which is unintentionally doped. The total thickness of the first modified region 242 and the second modified region 211 is defined as a diffusion depth D1, that is, a diffusion distance of the second dopant along a vertical direction. The diffusion depth D1 is greater than the fourth thickness T4 of the second semiconductor layer 24. The diffusion depth D1 can be adjusted to change the capacitance and response time of the light-detecting device 100.

The contact structure 30 is disposed on the incident plane 243 of the second semiconductor layer 24. Referring to FIG. 1A, the contact structure 30 is located in the first modified region 242 without contacting the unmodified region 241, so as to reduce the dark current of the light-detecting device 100. In one embodiment, the contact structure 30 includes the second dopant and optionally includes the third dopant. When the contact structure 30 includes the third dopant, the doping concentration of the second dopant is greater than the doping concentration of the third dopant so that the contact structure 30 has the second conductivity type. In one embodiment, the doping concentration of the third dopant in the contact structure 30 is not greater than $5\times10^{16}/cm^3$, and the doping concentration of the second dopant in the contact structure 30 is greater than $8\times10^{17}/cm^3$. In one embodiment, a thickness of the contact structure 30 may be between 30 nm and 150 nm. The contact structure 30 can be patterned through a patterning process (such as lithography and etching) to reduce shielding of the incident light.

As shown in FIG. 1A, the contact structure 30 is disposed along an edge of the first modified region 242, and the pattern of the contact structure 30 can be an open ring or a closed ring (not shown). To be more specific, the contact structure 30 has an inner edge adjacent to a geometric center of the first modified region 242 and an outer edge adjacent to the edge of the first modified region 242. There is a first spacing L1 between the outer edge of the contact structure 30 and the edge of the first modified region 242 along the horizontal direction. The first spacing L1 can be in the range of 1 μm to 20 μm.

In one embodiment, the base 10, the first absorption layer 21, the second absorption layer 22, the first semiconductor layer 23, the second semiconductor layer 24, the third semiconductor layer 25 and the contact structure 30 can be a III-V compound semiconductor material, and can be a binary III-V semiconductor, a ternary III-V semiconductor or a quaternary III-V semiconductor, such as AlGaInAs, AlGaInP, AlInGaN, AlAsSb, InGaAsP, InGaAsN, AlGaAsP, GaAs, InGaAs, AlGaAs, AlInAs, GaAsP, GaP, InGaP, AlInP, GaN, InP, InGaN or AlGaN.

As shown in FIGS. 1A and 1B, the passivation layer 40 is disposed on the incident plane 243 of the second semiconductor layer 24. More specifically, the passivation layer 40 extends from an edge of the second semiconductor layer 24 to the edge of the first modified region 242 along the horizontal direction and covers a portion of the first modified regions 242, so as to protect the incident plane 243 from current leakage. From top view, the passivation layer 40 is a hollow pattern and includes an opening H corresponding to the first modified region 242 so that a portion of the incident plane 243 located on the first modified region 242 is exposed. In one embodiment, the opening H has a width smaller than the second width W2. The passivation layer 40 and the contact structure 30 can be in direct contact or not in contact.

Referring to FIGS. 1A, 1B and 1D, the first electrode 50 is disposed on the incident plane 243 and connects the contact structure 30 and the passivation layer 40. The first electrode 50, the passivation layer 40 and the contact structure 30 are stacked along the vertical direction. The first electrode 50 includes a pad portion 51 connecting to external wires and an extending portion 52 connecting to the pad portion 51. In this embodiment, the pad portion 51 is located on the unmodified region 241 and does not overlap the first modified region 242 in the vertical direction, and is disposed on the passivation layer 40 without contacting the unmodified region 241. The extending portion 52 is disposed on the first modified region 242 and overlaps the contact structure 30 in the vertical direction, so the first electrode 50 and the modified region 242 form an electrical connection. The contact structure 30 is disposed below the extending portion 52 and directly contacts the extending portion 52. The contact structure 30 forms a low-resistance interface of the extending portion 52 for improving the sensitivity of photocurrent detection. In other embodiments, both the pad portion 51 and the extending portion 52 can be disposed on the first modified region 242 (not shown), and the contact structure 30 can be optionally disposed below the pad portion 51. The first electrode 50 can also be formed with a pattern through the aforementioned patterning process. In this embodiment, the extending portion 52 of the first electrode 50 is corresponding to the contact structure 30 and has a pattern the same as the pattern of the contact structure 30. In one embodiment, the extending portion 52 may span across the edge of the first modified region 242 to overlap with the unmodified region 241 in the vertical direction. In the overlapped region, the extending portion 52 contacts the passivation layer 40 and does not contact the unmodified region 241 directly. From the sectional view, the extending portion 52 contacts the contact structure 30 and the passivation layer 40, and may optionally contact the first modified region 242 directly to form a larger contact area. In the horizontal direction, the pad portion 51 has a third width W3, and the extending portion 52 has a fourth width W4 smaller than the third width W3.

Figure 1C:
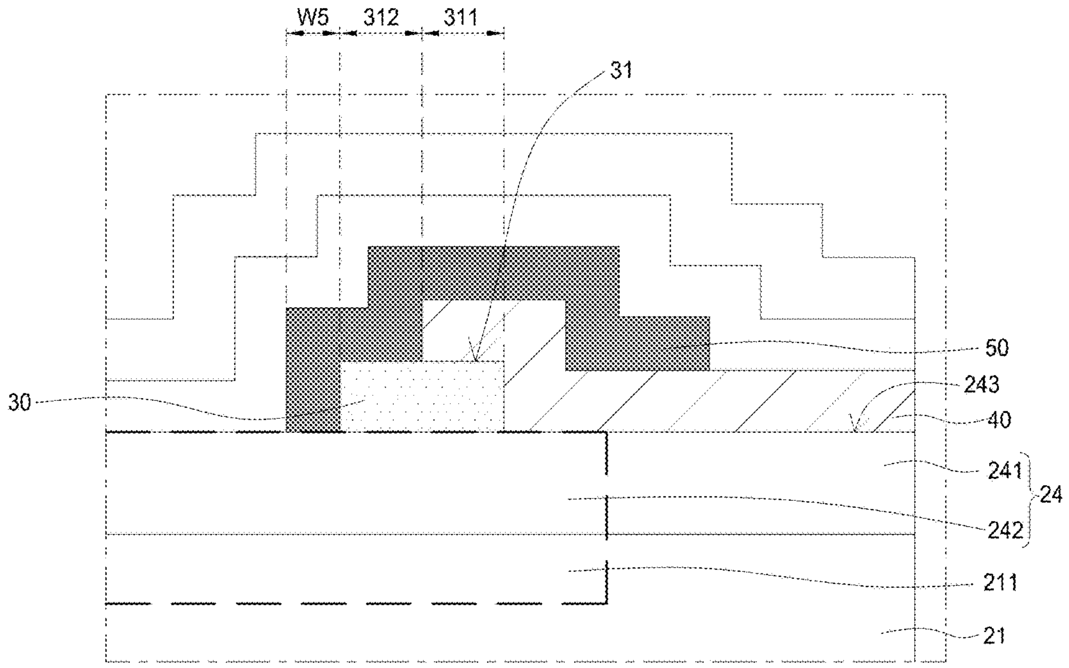
FIG. 1C shows a partial enlarged view of region B of the light-detecting device in FIG. 1B.
Figure 1D:
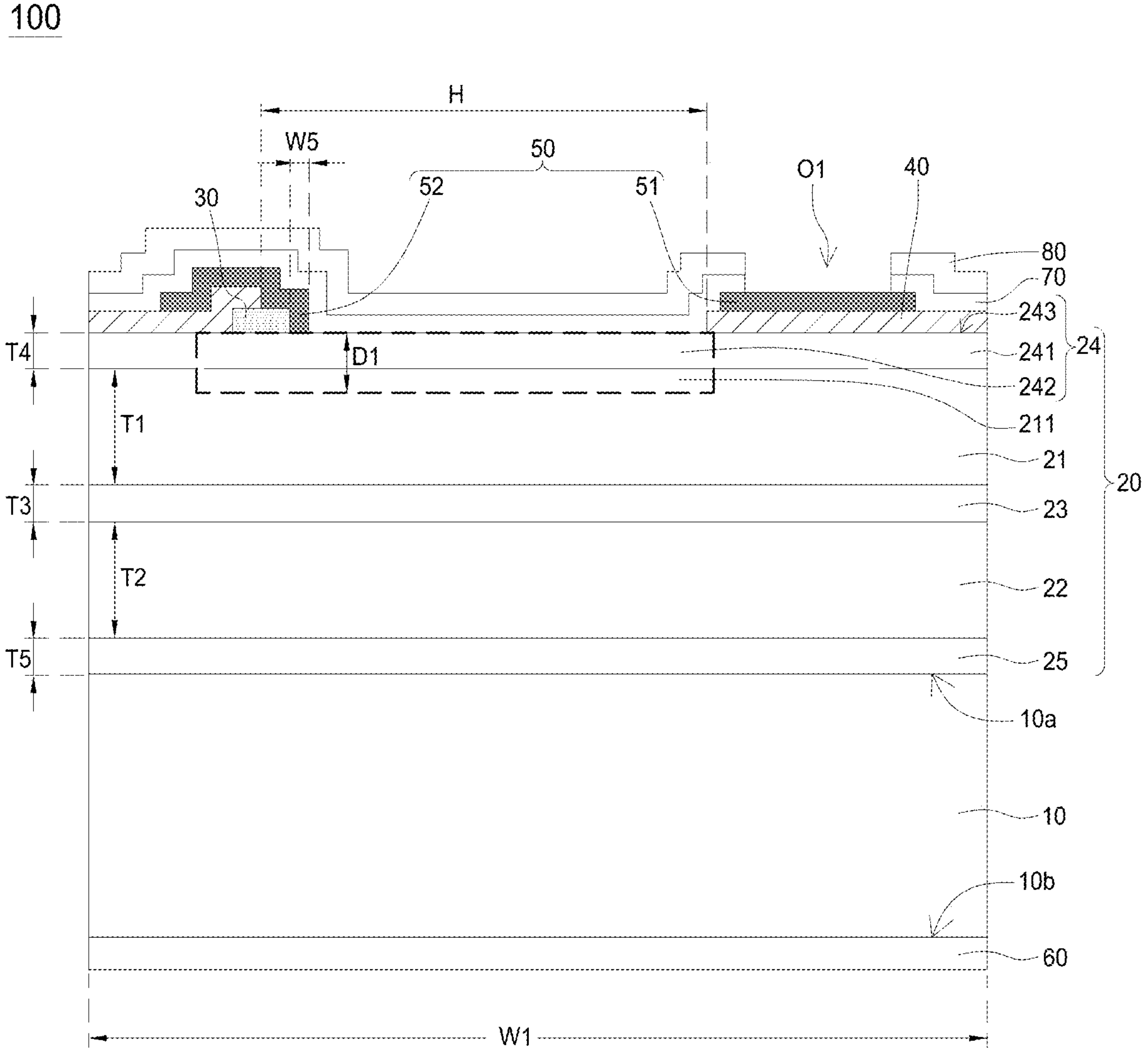
FIG. 1D shows a schematic sectional view of the light-detecting device in FIG. 1A along a section line B-B'.

FIG. 1C is a partially enlarged view of an area B shown in FIG. 1B. The contact structure 30 has a top surface 31 which includes a first area 311 and a second area 312. The first area 311 is closer to the outer edge of the contact structure 30 than the second area 312. In this embodiment, the passivation layer 40 covers the outer edge of the contact structure 30 and the first area 311 of the top surface 31. The first electrode 50 covers the passivation layer 40, the inner edge of the contact structure 30 and the second area 312 of the top surface 31, and directly contacts the first modified region 242. In the horizontal direction, a portion of the first electrode 50 that directly contacts the second semiconductor layer 24 has a fifth width W5, and the fifth width W5 can be between 1 μm and 50 μm. In one embodiment, the passivation layer 40 does not directly contact the contact structure 30 (not shown), and the first electrode 50 covers the passivation layer 40, the first area 311 of the top surface 31 and the outer edge of the contact structure 30 (not shown). As such, the contact area between the first modified region 242 and the first electrode 50 can be reduced and the contact resistance can be lower.

The first electrode 50 and the second electrode 60 can have a single-layer or multi-layer structure and include metal materials, such as aluminum (Al), chromium (Cr), copper (Cu), tin (Sn), gold (Au), and nickel. (Ni), titanium (Ti), platinum (Pt), lead (Pb), zinc (Zn), cadmium (Cd), antimony (Sb), cobalt (Co), beryllium (Be), germanium (Ge) or alloys which include the aforementioned metal materials.

The light-detecting device 100 may optionally include an anti-reflective layer 70 or/and a filter layer 80. As shown in FIG. 1B, the anti-reflective layer 70 is disposed on the second semiconductor layer 24, the first electrode 50 and the passivation layer 40, and the anti-reflective layer 70 directly contacts the first modified region 242 through the opening H. The anti-reflective layer 70 can reduce the reflectivity of the incident plane 243 and improve the light absorption effect. Besides, the anti-reflective layer 70 can also provide a passivation effect on the first modified region 242 to improve the reliability of the light-detecting device 100 and reduce dark current. The thickness and material of the anti-reflection layer 70 can be selected according to the target wavelength range to reduce reflection. In one embodiment, the anti-reflective layer 70 may be a multi-layer structure formed by different materials that are alternately stacked, and the anti-reflective layer 70 may have a gradient refractive index. For example, the anti-reflective layer 70 may be formed by high refractive index materials and low refractive index materials that are alternately stacked with each other.

The filter layer 80 is disposed on the second semiconductor layer 24, the first electrode 50 and the passivation layer 40, and covers the first modified region 242, the first electrode 50 and the passivation layer 40. The filter layer 80 can allow the light with a wavelength in the target wavelength range pass and filter the light with a wavelength outside the target wavelength range, so as to further reduce noise caused by absorption of the light with a wavelength outside the target wavelength range. In one embodiment, a first opening O1 is formed in the anti-reflection layer 70 and the filter layer 80. As shown in FIG. 1D, the first opening O1 is disposed corresponding to the pad portion 51 in the vertical direction and penetrates the anti-reflection layer 70 and the filter layer 80, so that the pad portion 51 can connect to the external wires through the first opening O1. In one embodiment, the first opening O1 has a width equal to or less than the third width W3 of the pad portion 51.

The passivation layer 40 and the anti-reflection layer 70 can include insulating materials, such as tantalum oxide (TaOx), aluminum oxide (AlOx), silicon oxide (SiOx), titanium oxide (TiOx), silicon nitride (SiNx), silicon oxynitride (SiOxNy), niobium pentoxide ($Nb_2O_5$) or spin-on glass (SOG). The filter layer 80 can be a single-layer structure or a multi-layer structure. For example, the filter layer 80 can be a multi-layer dielectric film formed by high refractive index materials and low refractive index materials that are alternately stacked (such as a combination of $TiO_2$/a-Si/$SiO_2$), or it can be a polymer layer with a specific light absorption spectrum.

Referring to FIG. 1B or 1D. in one embodiment, the passivation layer 40, the anti-reflection layer 70 and the filter layer 80 all cover the edge of the second semiconductor layer 24. That is, the passivation layer 40, the anti-reflection layer 70 and the filter layer 80 have a width in the horizontal direction that is substantially equal to the first width W1 of the base 10, so that the whole incident plane 243 can be protected. In this embodiment, the filter layer 80 is disposed on the anti-reflection layer 70. In one embodiment, the filter layer 80 can be configured to have an effect of anti-reflection, so that only the filter layer 80 can achieve the functions of anti-reflection, filtering the light outside the target wavelength range and passivation protection.

Figure 2:
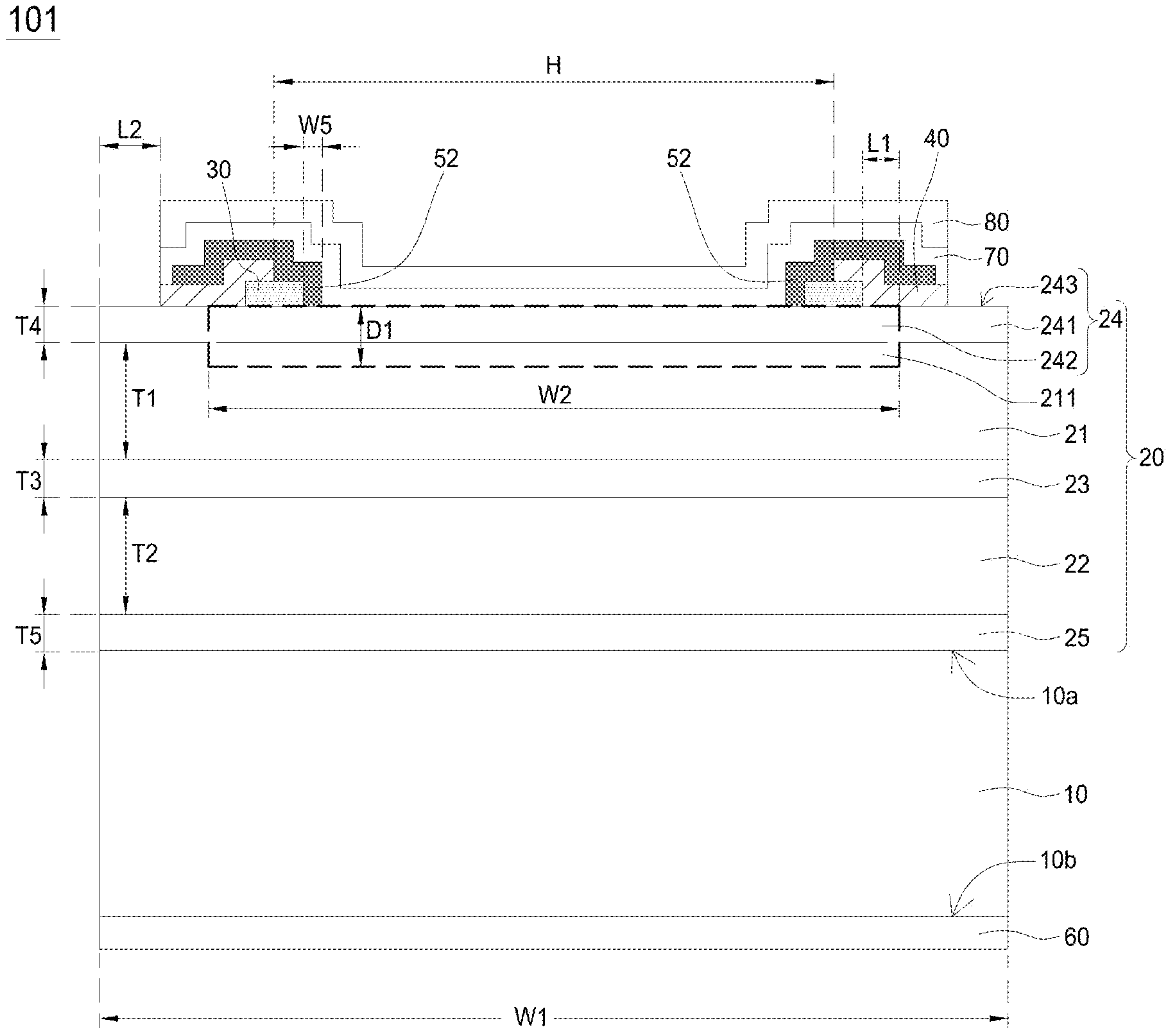
FIG. 2 shows a schematic sectional view of a light-detecting device according to one embodiment of the present disclosure.

FIG. 2 is a schematic sectional view of a light-detecting device 101 according to one embodiment of the present disclosure. The light-detecting device 101 has a structure similar to the light-detecting device 100. In this embodiment, there is a second distance L2 between the edge of the second semiconductor layer 24 and edges of the passivation layer 40, the anti-reflection layer 70 and the filter layer 80. That is, a periphery portion of the second semiconductor layer 24 is exposed, so that a yield of the dicing process can be improved. In this embodiment, widths of the passivation layer 40, the anti-reflection layer 70 and the filter layer 80 in the horizontal direction are smaller than the first width W1 and larger than the second width W2. The second distance L2 can be in the range of 10 μm to 30 μm. The positions, relative relationships, and material compositions of other layers or structures as well as structural variations in the light-detecting device 101 have been described in detail in previous embodiments, and are not repeatedly described herein.

Figure 3:
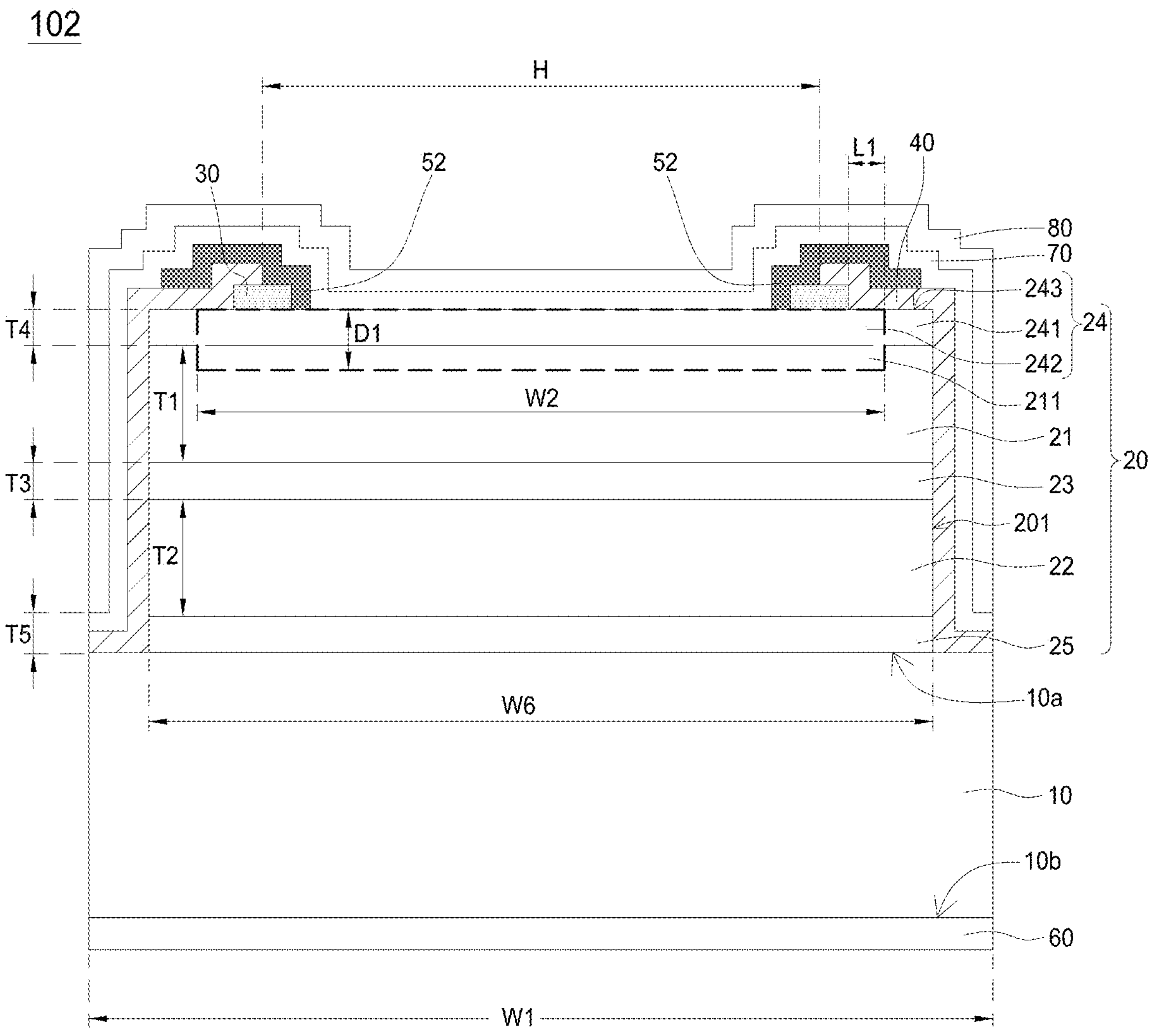
FIG. 3 shows a schematic sectional view of a light-detecting device according to one embodiment of the present disclosure.

FIG. 3 is a schematic sectional view of a light-detecting device 102 according to one embodiment of the present disclosure. The light-detecting device 102 has a structure similar to the light-detecting device 100. In this embodiment, the semiconductor stack 20 has a sixth width W6. The sixth width W6 is smaller than the first width W1 of the base 10 and larger than the second width W2 of the first modified region 242, so that a part of the first surface 10*a* is exposed. In this embodiment, in addition to covering the incident plane 243, the passivation layer 40 extends downward from the incident plane 243 to cover a side surface 201 of the semiconductor stack 20 in the vertical direction, so as to protect the semiconductor stack 20 from the external environment and improve reliability.

In one embodiment, the anti-reflection layer 70 or/and the filter layer 80 also extends downward from the incident plane 243 to cover the side surface 201 and the passivation layer 40. As such, the light entering the semiconductor stack 20 from the side surface 201 can pass through the filter layer 80 first and reduces absorption of the light outside the target wavelength range. The semiconductor stack 20 can be reduced from the first width W1 to the sixth width W6 through an etching process. In other embodiments, any layer of the semiconductor stack 20 or the base 10 can be selectively exposed by controlling parameters of the etching process. For example, the etching process can be stopped when reaching the third semiconductor layer 25, so that a part of the third semiconductor layer 25 can be exposed (not shown). Then the passivation layer 40, the anti-reflection layer 70 and the filter layer 80 cover the side surface 201 and an exposed surface of the third semiconductor layer 25 (not shown). The positions, relative relationships, and material compositions of other layers or structures as well as structural variations in the light-detecting device 102 have been described in detail in previous embodiments, and are not repeatedly described herein.

Figure 4:
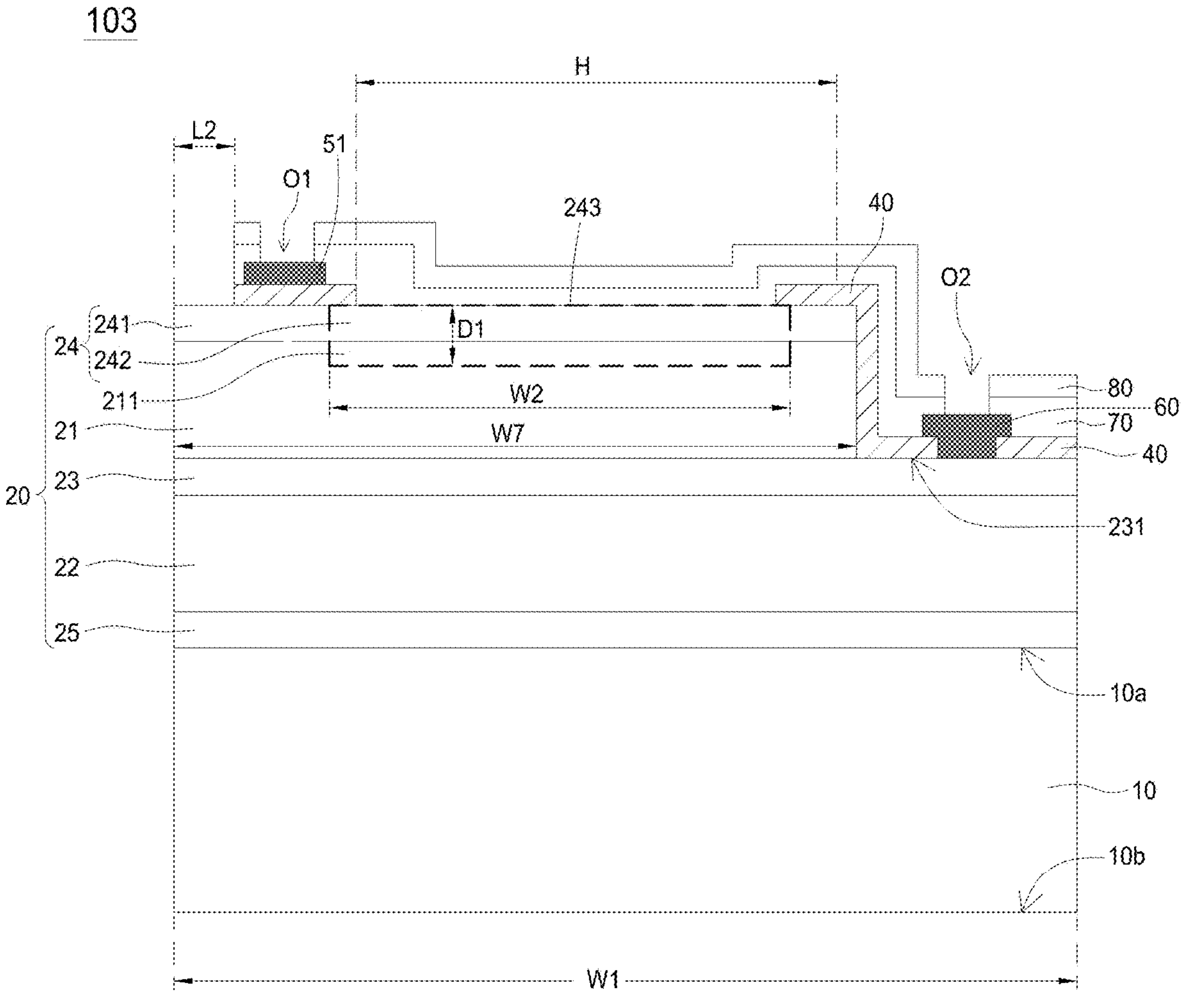
FIG. 4 shows a schematic sectional view of a light-detecting device according to one embodiment of the present disclosure.

FIG. 4 is a schematic cross-sectional view of a light-detecting device 103 according to one embodiment of the present disclosure. The light-detecting device 103 has a structure similar to the light-detecting device 100. In this embodiment, the second absorption layer 22, the first semiconductor layer 23, the third semiconductor layer 25 and the base 10 all have the first width W1, and the first absorption layer 21 and the second semiconductor layer 24 both have a seventh width W7. The seventh width W7 is smaller than the first width W1, and the seventh width W7 is larger than the second width W2. In this embodiment, the first semiconductor layer 23 has a third surface 231 that is not covered by the first absorption layer 21, and the second electrode 60 is disposed on the third surface 231 and electrically connects to the first semiconductor layer 23. In this embodiment, the first electrode 50 is arranged in the same manner as the light-detecting device 100 shown in FIGS. 1B and 1D. That is, the pad portion 51 is disposed on the unmodified region 241 and is located on the passivation layer 40 without directly contacting the unmodified region 241. The extending portion 52 (not shown) is disposed on the first modified region 242 and connects to the pad portion 51, and the extending portion 52 and the first modified region 242 of the second semiconductor layer 24 forms electrical connection through the contact structure 30 (not shown), so as to form the horizontal type light-detecting device 103.

In one embodiment, in addition to covering the incident plane 243, the passivation layer 40 extends downward to cover a side surface of the first absorption layer 21, a side surface of the second semiconductor layer 24 and the third surface 231 to protect the semiconductor stack 20 from external environment. In one embodiment, the anti-reflection layer 70 or/and the filter layer 80 also extends downward from the incident plane 243 to cover the side surface of the first absorption layer 21, the side surface of the second semiconductor layer 24, the third surface 231 and the second electrode 60, and a second opening O2 is formed in the anti-reflection layer 70 and the filter layer 80. The second opening O2 is disposed corresponding to the second electrode 60 in the vertical direction, so that the second electrode 60 can connect to the external wires through the second opening O2. In one embodiment, a contact layer (not shown) can be optionally disposed between the second electrode 60 and the first semiconductor layer 23 to form ohmic contact and improve the performance of photocurrent detection. The positions, relative relationships, and material compositions of other layers or structures as well as structural variations in the light-detecting device 103 have been described in detail in previous embodiments, and are not repeatedly described herein.

Figure 5:
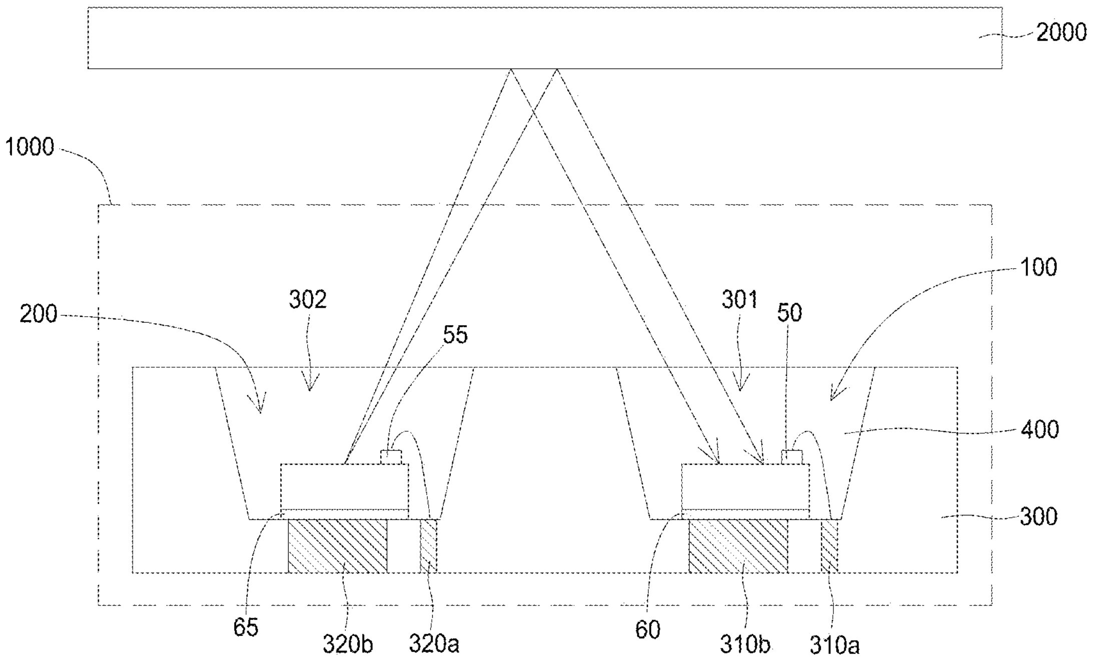
FIG. 5 shows a schematic sectional view of a light-detecting module according to one embodiment of the present disclosure.

FIG. 5 shows a photo-detecting module 1000 and the application thereof in accordance with one embodiment of the present disclosure. The photo-detecting module 1000 includes a carrier 300, a light-emitting device 200, the light-detecting device 100 and an encapsulation structure 400. The carrier 300 includes a first trench 301 and a second trench 302. The light-detecting device 100 and the light-emitting device 200 are located in the first trench 301 and the second trench 302 respectively. The encapsulation structure 400 encapsulates the light-detecting device 100 and the light-emitting device 200 which are in the first trench 301 and the second trench 302. The light-detecting device 100 may be replaced by the light-detecting devices 101, 102, or 103 described in the previous embodiments. The light-emitting device 200 includes a third electrode 55 and a fourth electrode 65, and further includes an active layer capable of emitting light with a specific wavelength. For example, the light-emitting device 200 can emit infrared light with a peak wavelength in a range of 800 nm to 2000 nm, such as 810 nm, 850 nm, 910 nm, 940 nm, 1050 nm, 1070 nm, 1100 nm, 1200 nm, 1300 nm, 1400 nm, 1450 nm, 1500 nm, 1550 nm, 1600 nm, 1650 nm, or 1700 nm. The wavelength of the light emitted by the light-emitting device 200 is within the target wavelength range of the light-detecting device 100. The light-emitting device 200 and the light-detecting device 100 can have the same material series, for example, the light-emitting device 200 and the light-detecting device 100 both include AlInGaAs series, AlGaInP series, InGaAs series and/or InGaAsP series.

The carrier 300 includes first circuit structures 310*a*, 310*b* electrically connected to the first electrode 50 and the second electrode 60 of the light-detecting device 100 respectively to receive electrical signals (such as current or voltage) generated by the light-detecting device 100. The carrier 300 includes second circuit structures 320*a*, 320*b* electrically connected to the third electrode 55 and the fourth electrode 65 of the light-emitting device 200 respectively to drive the light-emitting device 200 to emit the light. The photo-detecting module 1000 may be incorporated in a mobile device, and may be used as a proximity sensor or a structured light scanner.

FIG. 5 shows an embodiment of using the photo-detecting module 1000 as a proximity sensor. When the mobile device including the photo-detecting module 1000 approaches an object 2000, the light with the specific wavelength emitted by the light-emitting device 200 is reflected by the object 2000 to the light-detecting device 100, and the electrical signal is generated by the light-detecting device 100 for sensing the existence of the object 2000 and triggering an action, e.g. turning on or off the screen of the mobile device accordingly. The carrier 300 can be a package submount or a printed circuit board (PCB). The first to the fourth electrodes 50, 55 60 65, the first circuit structures 310*a*, 310*b* and the second circuit structures 320*a*, 320*b* can include a single-layer or multi-layer structure and include nickel (Ni), titanium (Ti), platinum (Pt), palladium (Pd), silver (Ag), gold (Au), aluminum (Al or copper (Cu). The encapsulation structure 400 can include an organic polymer or inorganic dielectric material, for example, epoxy or silicone.

The embodiments of the present disclosure will be described in detail below with reference to the drawings. In the descriptions of the specification, specific details are provided for a full understanding of the present disclosure. The same or similar components in the drawings will be denoted by the same or similar symbols. It is noted that the drawings are for illustrative purposes only and do not represent the actual dimensions or quantities of the components. Some of the details may not be fully sketched for the conciseness of the drawings.

What is claimed is:

1. A light-detecting device, comprising:

a base;

a first absorption layer located on the base and having a first band gap and a first thickness;

a second absorption layer located between the first absorption layer and the base and having a second band gap and a second thickness; and a first semiconductor layer located on the first absorption layer and having a third band gap;

wherein the first thickness is larger than the second thickness, and the third band gap is greater than the first band gap and the second band gap; and wherein the second absorption layer comprises a first dopant to have a first conductivity type, and the first absorption layer is undoped or unintentionally doped.

2. The light-detecting device according to claim 1, wherein the second absorption layer has an upper surface and a lower surface, the first dopant is distributed from the upper surface to the lower surface.

3. The light-detecting device according to claim 1, wherein the first thickness is between 1000 nm and 4000 nm.

4. The light-detecting device according to claim 1, wherein the first semiconductor layer comprises a first modified region and an unmodified region surrounding the first modified region, the first modified region comprising a second dopant to have a second conductivity type different from the first conductivity type and the unmodified region comprises a third dopant to have the first conductivity type.

5. The light-detecting device according to claim 4, wherein the first modified region has a first doping concentration, and the unmodified region has a second doping concentration smaller than the first doping concentration.

6. The light-detecting device according to claim 4, wherein the first absorption layer comprises a second modified region corresponding to the first modified region, and the second modified region comprises the second dopant to have the second conductivity type.

7. The light-detecting device according to claim 4, wherein the first dopant is different from the second dopant.

8. The light-detecting device according to claim 4, further comprising an electrode located on a side of the first semiconductor layer away from the first absorption layer.

9. The light-detecting device according to claim 8, further comprising a passivation layer located between the first semiconductor layer and the electrode.

10. The light-detecting device according to claim 9, further comprising a contact structure located between the first semiconductor layer and the electrode.

11. The light-detecting device according to claim 10, wherein the contact structure is located on the first modified region without contact the unmodified region.

12. The light-detecting device according to claim 10, wherein the passivation layer comprises a hole, and the contact structure is disposed in the hole.

13. The light-detecting device according to claim 10, wherein the contact structure comprises a top surface contacting the electrode and the passivation layer.

14. The light-detecting device according to claim 4, wherein the first dopant and the third dopant are the same.

15. The light-detecting device according to claim 1, wherein the first semiconductor layer has a thickness smaller than the first thickness and the second thickness.

16. The light-detecting device according to claim 1, further comprising a second semiconductor layer located between the base and the second absorption layer, wherein the second semiconductor layer has a fourth band gap greater than the first band gap and the second band gap.

17. The light-detecting device according to claim 1, wherein the second semiconductor layer has a thickness smaller than the first thickness and the second thickness.

18. The light-detecting device according to claim 1, wherein the second thickness is between 500 nm and 3000 nm.

19. The light-detecting device according to claim 1, wherein the first dopant in the second absorption layer has a doping concentration in a range of $5\times10^{17}/cm^3$ to $5\times10^{18}/cm^3$.

20. A photo-detecting module, comprising:

a carrier;

a light-emitting device located on the carrier and emitting a light;

the light-detecting device of claim 1 located on the carrier and detecting the light; and an encapsulation structure covering the light emitting device and the light-detecting device.

* * * * *